United States Patent
Lilin et al.

(10) Patent No.: US 11,112,698 B2
(45) Date of Patent: Sep. 7, 2021

(54) PHOTORESIST WITH GRADIENT COMPOSITION FOR IMPROVED UNIFORMITY

(71) Applicant: TAIWAN SEMICONDUCTOR MANUFACTURING CO., LTD., Hsinchu (TW)

(72) Inventors: Chang Lilin, Taipei (TW); Ching-Yu Chang, Yilang County (TW); Chin-Hsiang Lin, Hsin-chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/723,582

(22) Filed: Oct. 3, 2017

(65) Prior Publication Data
US 2018/0151351 A1    May 31, 2018

Related U.S. Application Data

(60) Provisional application No. 62/427,533, filed on Nov. 29, 2016.

(51) Int. Cl.
| | |
|---|---|
| G03F 7/004 | (2006.01) |
| G03F 7/30 | (2006.01) |
| G03F 7/38 | (2006.01) |
| H01L 21/027 | (2006.01) |
| G03F 7/42 | (2006.01) |
| G03F 7/20 | (2006.01) |
| G03F 7/09 | (2006.01) |
| G03F 7/095 | (2006.01) |
| G03F 7/039 | (2006.01) |
| G03F 7/40 | (2006.01) |

(52) U.S. Cl.
CPC .............. *G03F 7/30* (2013.01); *G03F 7/0045* (2013.01); *G03F 7/0046* (2013.01); *G03F 7/0397* (2013.01); *G03F 7/091* (2013.01); *G03F 7/095* (2013.01); *G03F 7/40* (2013.01); *G03F 7/423* (2013.01); *G03F 7/70* (2013.01); *H01L 21/0276* (2013.01); *G03F 7/38* (2013.01)

(58) Field of Classification Search
CPC ............. G03F 7/30; G03F 7/40; G03F 7/0397
USPC ........................................................ 430/326
See application file for complete search history.

(56) References Cited

U.S. PATENT DOCUMENTS

| | | | |
|---|---|---|---|
| 8,435,717 B2* | 5/2013 | Hagiwara | C07C 309/12 430/270.1 |
| 8,796,666 B1 | 8/2014 | Huang et al. | |
| 8,962,233 B2* | 2/2015 | Kawabata | C07D 327/08 430/270.1 |
| 9,012,132 B2 | 4/2015 | Chang | |
| 9,028,915 B2 | 5/2015 | Chang et al. | |
| 9,093,530 B2 | 7/2015 | Huang et al. | |

(Continued)

*Primary Examiner* — John S Chu
(74) *Attorney, Agent, or Firm* — Haynes and Boone, LLP

(57) ABSTRACT

The present disclosure provides an embodiment of a method for lithography patterning. The method includes coating a photoresist layer over a substrate, wherein the photoresist layer includes a first polymer, and a first photo-acid generator (PAG), and a chemical additive mixed in a solvent; performing an exposing process to the photoresist layer; and performing a developing process to the photoresist layer to form a patterned photoresist layer. The chemical additive has a non-uniform distribution in the photoresist layer.

20 Claims, 11 Drawing Sheets

(56) References Cited

U.S. PATENT DOCUMENTS

| | | | |
|---|---|---|---|
| 9,146,469 B2 | 9/2015 | Liu et al. | |
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 2007/0178405 A1* | 8/2007 | Kanda | G03F 7/0045 430/270.1 |
| 2008/0193872 A1* | 8/2008 | Caporale | G03F 7/0046 430/270.1 |
| 2008/0193879 A1* | 8/2008 | Allen | C08F 220/22 430/285.1 |
| 2009/0186300 A1* | 7/2009 | Furuya | G03F 7/0046 430/285.1 |
| 2009/0239176 A1* | 9/2009 | Kanda | G03F 7/0046 430/285.1 |
| 2011/0104612 A1* | 5/2011 | Anno | C08F 220/18 430/270.1 |
| 2011/0262865 A1* | 10/2011 | Nishimura | C08F 220/18 430/285.1 |
| 2014/0234761 A1* | 8/2014 | Shirakawa | G03F 7/11 430/15 |
| 2015/0355539 A1* | 12/2015 | Namai | C07C 51/02 430/285.1 |
| 2016/0048075 A1* | 2/2016 | Takizawa | G03F 7/20 428/195.1 |
| 2016/0070174 A1* | 3/2016 | Yamaguchi | C08F 220/28 428/195.1 |

* cited by examiner

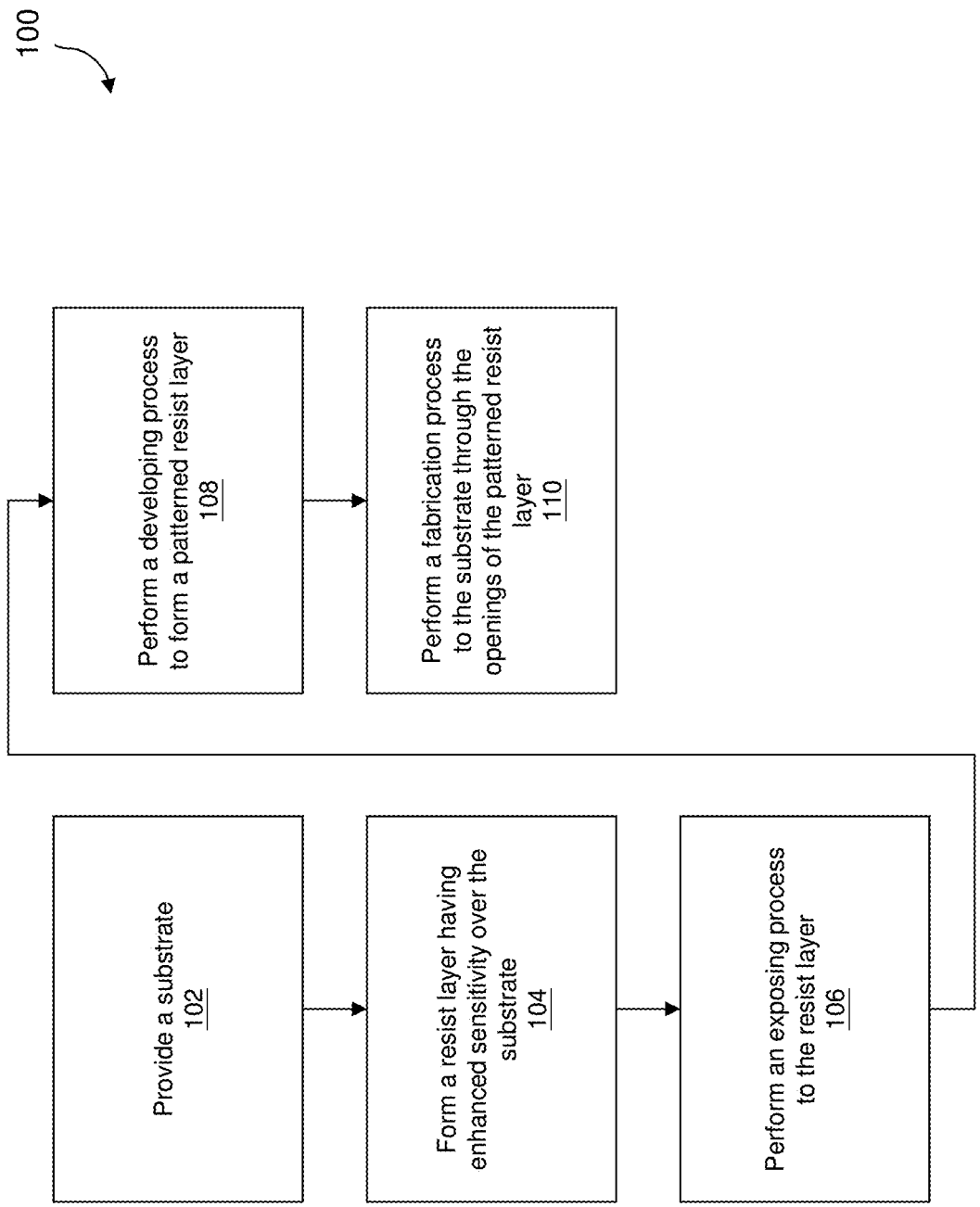

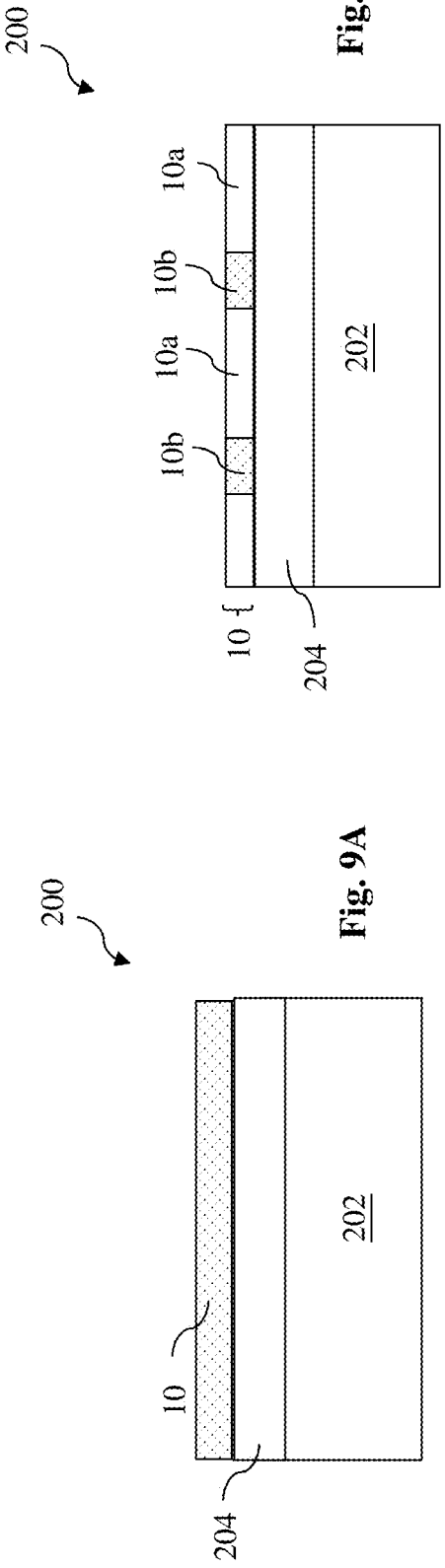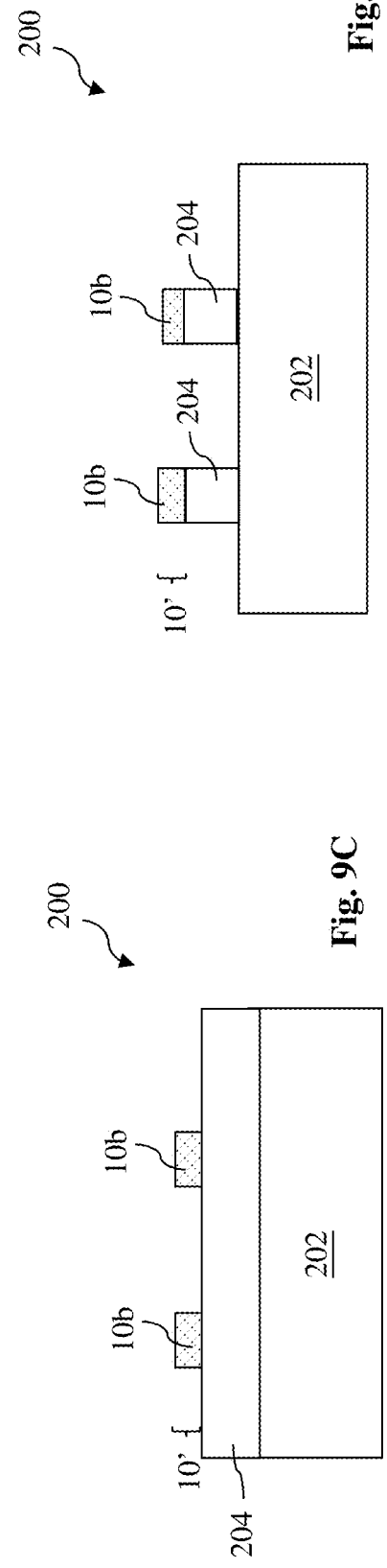

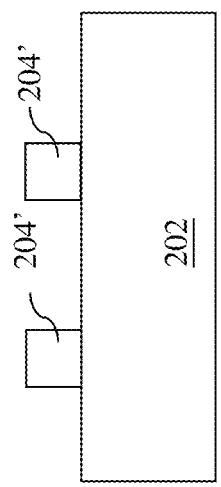

PHOTORESIST WITH GRADIENT COMPOSITION FOR IMPROVED UNIFORMITY

PRIORITY

This application is a non-provisional application which claims the benefit of U.S. Provisional Patent Application Ser. No. 62/427,533 filed Nov. 29, 2016, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. For example, the existing photolithography process includes coating photoresist to a substrate, exposing the photoresist through a reticle by electromagnetic wave. The photoresist adsorbs the electromagnetic wave and generate acid, which further deprotects the leaving group and renders the photoresist dissolve in the developer. Since the photoresist adsorbs the electromagnetic wave, the intensity of the electromagnetic wave in the bottom portion of the photoresist is less than that in the top portion. Thus, the deprotection reaction is less in the bottom portion and the dissolution rate will less in the bottom portion. This mechanism will lead to footing profile, especially in small hole and small trench pattern, because the electromagnetic wave intensity is less in these pattern. This footing profile induces non-uniform to the critical dimension (CD) of the patterned photoresist, such as at the after-etch-inspection (AEI) CD. The photoresist in the footing area functions as an etch mask when transferring the pattern from the photoresist to the underlying material layer, rendering the patterned material layer with non-uniform CD. Increasing the solubility of the photoresist may improve the issues associated with the footing profile but it will induce top round profile, reducing the thickness of the photoresist and degrading to the CD uniformity. What are needed are a photoresist and a method using the photoresist to address the issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 8 illustrates a flow chart of a lithography patterning method in accordance with some embodiments.

FIGS. 9A, 9B, 9C, 9D and 9E illustrate cross sectional views of a semiconductor structure at various fabrication stages, in accordance with some embodiments.

DETAILED DESCRIPTION

Figure 1A:
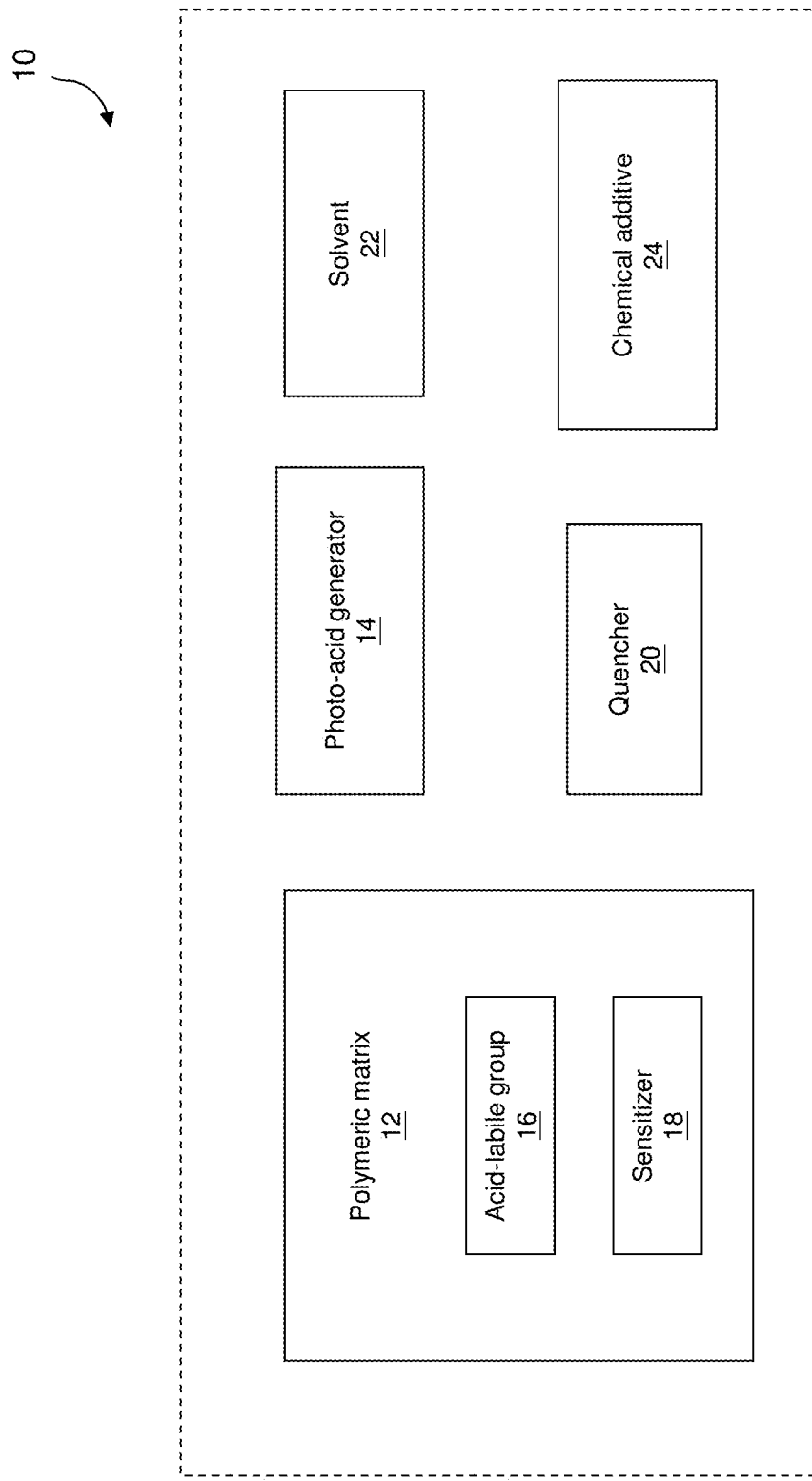
FIG. 1A is a block diagram illustrating a resist in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to compositions of photosensitive films in lithography and methods of using the same. In lithography patterning, after a resist film is exposed to a radiation, such as a UV, DUV or EUV radiation (or alternatively other radiation, such as an electron beam), it is developed in a developer (a chemical solution). The developer removes portions (such as exposed portions as in a positive-tone photoresist or unexposed portions as in a negative-tone photoresist) of the resist film, thereby forming a resist pattern which may include line patterns and/or trench patterns. The resist pattern is then used as an etch mask in subsequent etching processes, transferring the pattern to an underlying material layer. Alternatively, the resist pattern is then used as an ion implantation mask in subsequent ion implantation processes applied to the underlying material layer, such as a semiconductor layer.

A photoresist that employs the chemical amplification is generally referred to as a "chemically amplified resist (CAR)". FIG. 1A is a block view of a photoresist material (or simply resist) 10 constructed in accordance with some embodiments. The resist 10 includes various chemical components mixed in to a solution when it is coated to the workpiece, such as a semiconductor substrate. Those components of the resist 10 are described below in details according to various embodiments.

The resist 10 includes a polymeric material (simply polymer) 12 that resists to etching (or ion implantation) during semiconductor fabrication. In various embodiments, the polymer 12 includes a poly(norbornene)-co-malaic anhydride (COMA) polymer, a polyhydroxystyrene (PHS) polymer, or an acrylate-based polymer. For example, the acrylate-based polymer includes a poly (methyl methacrylate) (PMMA) polymer. Furthermore, PHS is also sensitive to EUV and is able to function as sensitizer for EUV resist. The polymer 12 also includes multiple side locations that may chemically bond with other chemical groups.

The resist 10 includes an acid generating compound, such as photoacid generator (PAG) 14. The PAG 14 absorbs radiation energy and generates acid. In some embodiments, the PAG 14 includes a phenyl ring. In a particular example, the PAG 14 includes a sulfonium cation, such as a triphenylsulfonium (TPS) group; and an anion, such as a triflate anion. In some examples, the anion includes a sulfonyl hydroxide or fluoroalky sulfonyl hydroxide.

In some examples, the resist 10 further includes ALG 16 or dissolution inhibitor bonded to the backbone of the polymer 12. The ALG 16 chemically changes in response to acid. For example, the ALG 16 is cleaved in the presence of acid so that the polarity of the resist is increased or alternatively decreased. Thus, the ALG 16 is deprotected by PAG in exposed areas of the resist layer. The exposed resist changes the polarity and dissolubility. For example, the exposed resist material has an increased dissolubility in a developer (for a positive-tone resist) or decreased dissolubility in a developer (for a negative-tone resist). When the exposing dose of the lithography exposing process reaches a dose threshold, the exposed resist material will be dissoluble in the developer or alternatively the exposed resist material will be soluble in the developer. In one example, the ALG 16 includes t-butoxycardbonyl (tBOC).

The resist 10 may further include a sensitizer 18 to increase the sensitivity and efficiency of the resist material. The PAG in the resist material may not be sensitive to EUV but is more sensitive to electrons or other radiation, such UV or DUV. Thus, by incorporating the sensitizer 18, the resist material has an enhanced sensitivity to the first radiation. Particularly, the sensitizer 18 is sensitive to the first radiation and be able to generate a second radiation in response to the first radiation. In the present embodiment, the first radiation is EUV radiation and the second radiation is electron(s). The sensitizer 18 absorbs EUV radiation and generates secondary electron. Furthermore, the PAG 14 is sensitive to the secondary electron, absorbs the secondary electron and generates acid. In various examples, the sensitizer 18 includes a fluorine-containing chemical, a metal-containing chemical, a phenol-containing chemical or a combination thereof. In some examples, the sensitizer 18 includes polyhydroxystyrene, poly-fluorostyrene, or poly-chlorostyrene. The sensitizer 18 may be bonded to the polymer 12.

In some embodiments, the resist 10 may include other components, such as quencher 20 that is a base type and is capable of neutralizing acid. Collectively or alternatively, the quencher may inhibit other active component of the resist, such as inhibiting PAG and photo acid from reaction. In one example, the quencher 20 includes a nitrogen atom having an unpaired electron capable of neutralizing an acid. Various chemical components are mixed in a solvent 22 to form a resist solution when it is coated on a workpiece. The solvent 22 may be aqueous solvent or organic solvent. The quencher 20 is distributed in the resist solution or is bonded to the polymer 12.

The resist 10 also includes a chemical additive 24 mixed with other components in the solvent 22. The chemical additive 24 is designed to change the resist and have a gradient distribution in the resist being coated on a workpiece, thus being able to tune the imaging effect of the resist and the quality of the corresponding exposing process.

In the existing photoresist layer and associated photolithography process, the photoresist layer will adsorb the radiation energy from the lithography exposing process and generate acid. The acid cleaves the ALG, causing the de-protection effect and making the exposed photoresist layer more dissolvable in the developer. Due to the adsorption of the radiation by the photoresist, the intensity of the radiation in the bottom portion of the photoresist layer is less than that in the top portion. The bottom portion of the photoresist layer has lower de-protection effect and lower dissolution rate than those of the top portion. This phenomenon will make footing profile especially in the small hole/trench pattern, which further induces non-uniform CD (or CD uniformity issues).

By incorporating the chemical additive 24 into the resist, the gradient distribution of the chemical additive 24 in the resist 10 being coated on the workpiece is able to compensate the above variation from the top portion to the bottom portion, therefore achieving improved lithography imaging resolution and patterning quality.

Figure 1B:
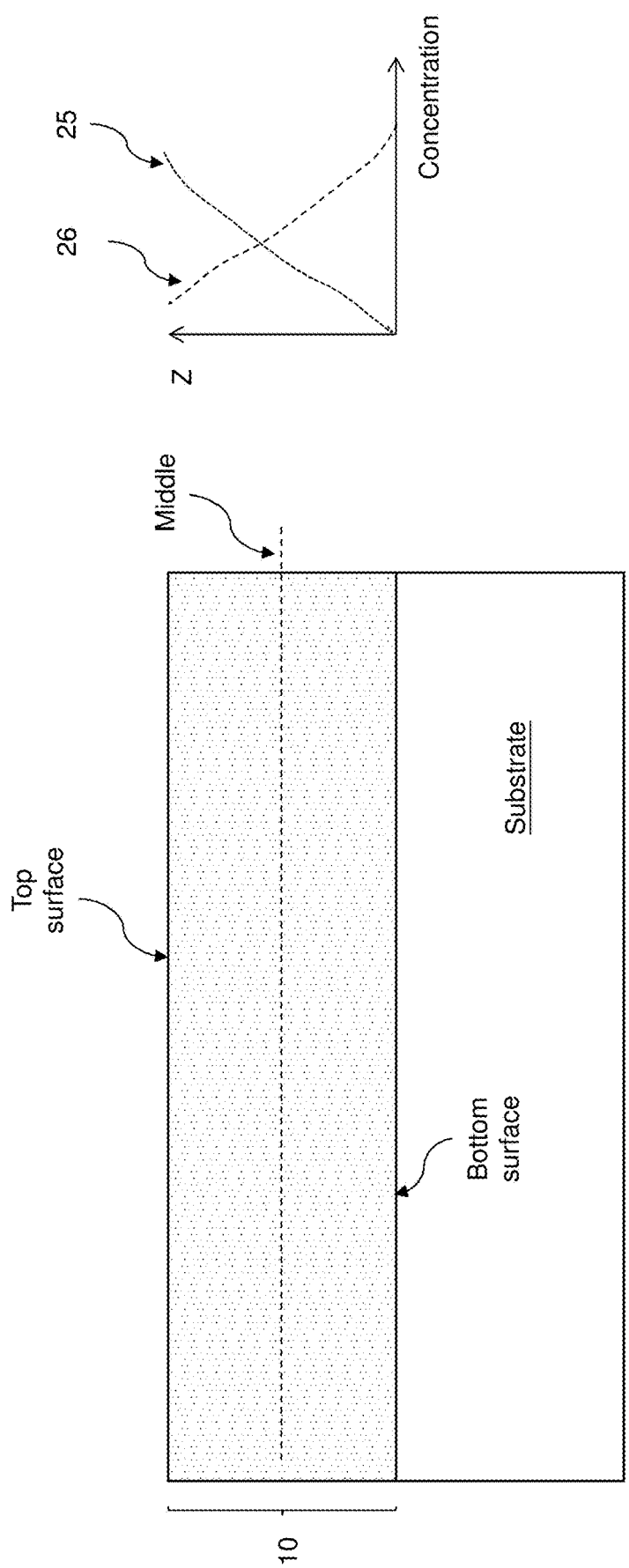
FIG. 1B is a sectional view of the resist coated on a substrate in accordance with some embodiments.

The gradient distribution or the gradient concentration of the chemical additive is further explained with reference to FIG. 1B as a sectional view of the resist layer 10 coated on a substrate. The concentration of the chemical additive 24 is not a constant from the top surface to the bottom surface. In one example, the concentration is decreasing from the top surface to the bottom surface, as illustrated in an exemplary curve 25, in which the vertical axis "Z" represents the distance from the bottom surface to the top surface and horizontal axis represents the concentration of the chemical additive in the resist layer 10. In another example, the concentration is increasing from the top surface to the bottom surface, as illustrated in an exemplary curve 26. For the distribution 26, it can also be described as a concentration in the top portion of the resist layer 10 is greater than the concentration in the bottom portion of the resist layer 10. The top portion and the bottom portion refer to the portions above and below the reference line "middle," respectively. In this case, the concentration of the top portion is an average concentration in the top portion and the concentration of the bottom portion is an average concentration in the bottom portion.

The chemical additive 24 is further described below in details according to various embodiments.

Figure 2:
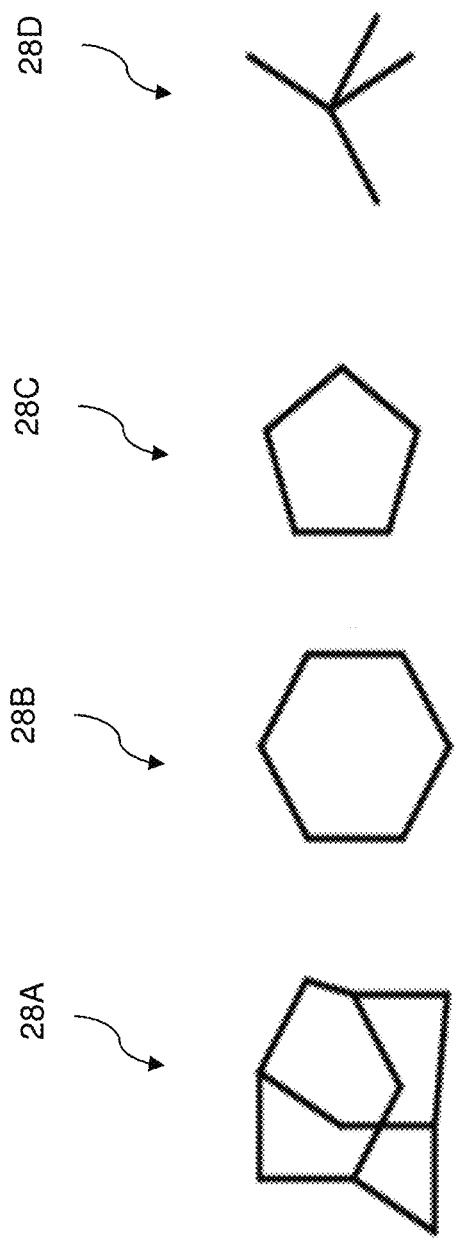
FIGS. 2, 3, 4, 5, 6, and 7 illustrate chemical structures of a chemical additive in the resist in accordance with some embodiments.
Figure 3:
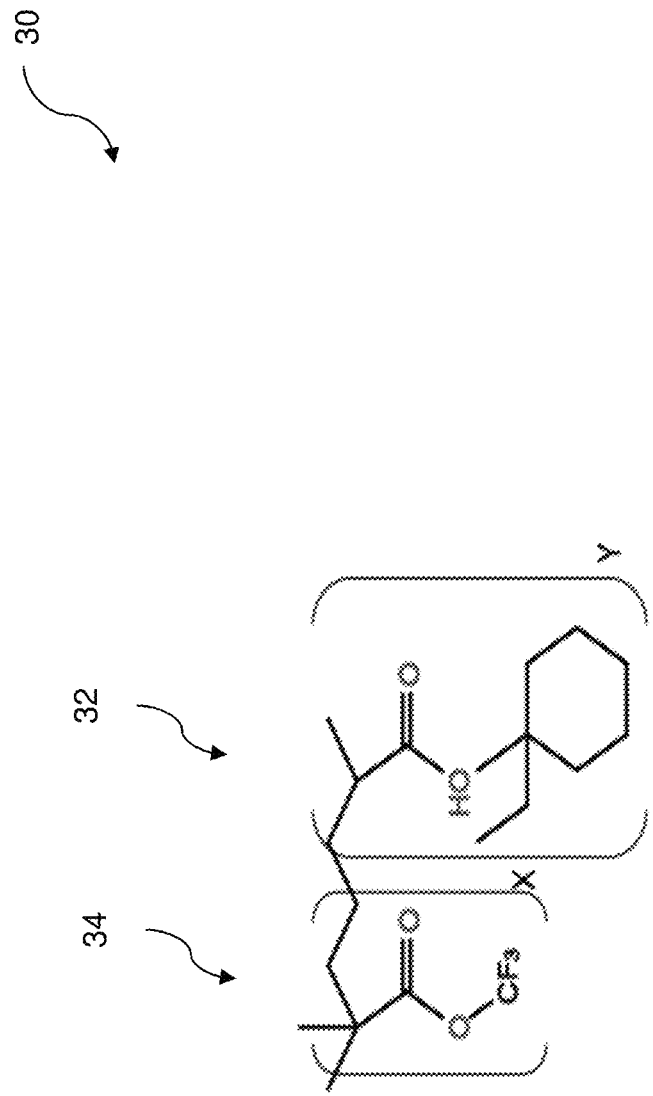

In one embodiment, the chemical additive 24 in the resist 10 is a dissolution additive. The dissolution additive has a chemical structure designed with a low surface tension and dissolution inhibitor. Particularly, the dissolution additive has a chemical structure having two functional units bonded together. In some examples, the first functional unit is a hydrophobic unit, such as alkyl group, cycloalkyl group or admantyl group. In some other examples, the first functional unit may include one of chemical structures 28A, 28B, 28C or 28D illustrated in FIG. 2. The first functional unit is able to decrease the dissolution of the resist in the developer. In some examples, the second functional unit is a fluorine-containing chemical, such as a fluorine polymer. The second functional unit has a surface tension lower than a certain value (such as 20 mN/m in the present example) so that the dissolution additive will float and has a gradient distribution in the coated resist layer, particularly, the gradient distribution with decreasing concentration from the top to the bottom of the resist layer. One example of the dissolution additive has a chemical structure 30 illustrated in FIG. 3. The chemical structure 30 is a copolymer having a first structural unit 32 and a second structural unit 34 bonded together. Two structures units 32 and 34 have first and second functions, respectively, corresponding to the first and second functional units. Particularly, the first structural unit 32 functions to inhibit the dissolution rate of the resist in the developer while the second structural unit 34 functions to achieve a gradient distribution. The subscripts X and Y are proper integers. Dissolution additive 30 is designed with X and Y to meet above the criteria for better resist imaging quality. For example, the dissolution additive has a molecular weight greater than 4000 and additionally greater than that of the polymer 12 so that the dissolution additive has a gradient distribution, especially from a higher concentration at the top surface to a lower concentration at the bottom surface of the resist.

The resist having the dissolution additive incorporated therein with a gradient distribution, the resist layer has a higher dissolution rate in the bottom portion and a lower dissolution rate in the top portion of the resist layer. Accordingly, it reduces the footing profile and improves CD uniformity.

Figure 4:
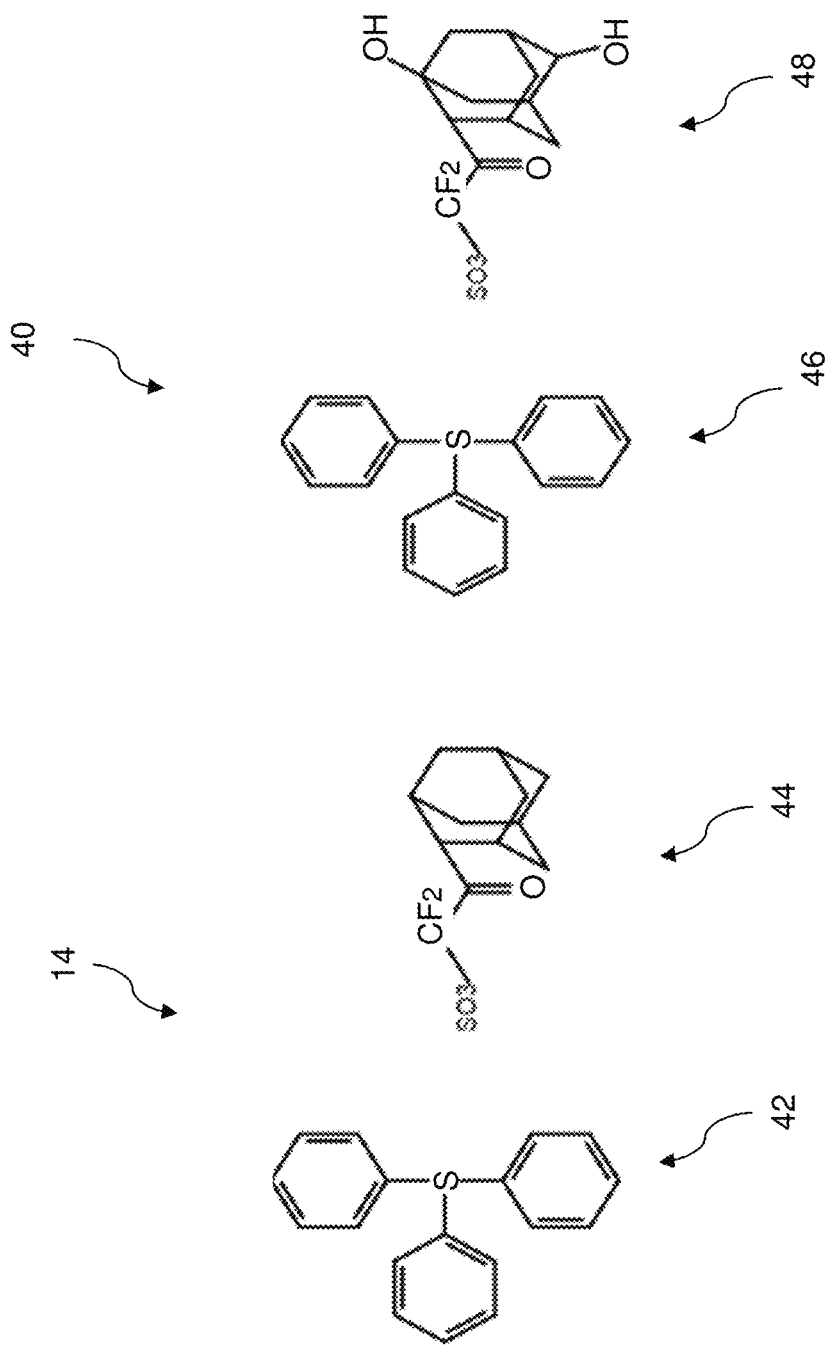

In another embodiment, the chemical additive 24 in the resist 10 is a PAG additive (or referred to as a second PAG). The PAG additive is another type of PAG different from the PAG 14 in chemical structure. The PAG additive is designed to function as photo-acid generator and further have a strong polar unit to achieve a gradient distribution in the resist 10. Particularly, the PAG additive has a chemical structure having two functional units bonded together. The first functional unit is a photon-sensitive unit that is able to generate acid during the lithography exposing process. The second functional unit is the strong polar unit that can interact with the middle layer, which will be further described later. In some examples, the chemical structures of both the PAG 14 and the PGA additive 40 are provided in FIG. 4 as a comparison according to some examples. The PAG 14 includes two chemical units 42 and 44 while the PAG additive 40 includes the photo-sensitive unit 46 and the strong polar unit 48. Due to the interaction between the strong polar unit 48 of the PAG additive 40 and the middle layer, the PGA additive 40 has higher concentration at bottom portion of the resist 10 than the top portion of the resist 10. Specifically, the PAG additive 40 has a gradient contribution in the resist layer such that the corresponding PAG additive concentration increases from the top portion to the bottom portion of the resist layer. The PAG 14 has a substantial uniform distribution in the resist layer. Collectively from both PAG 14 and the PAG additive, higher PAG concentration in the bottom portion than the top portion of the resist layer compensates the lower de-protection effect, reduces the footing profile and improves CD uniformity.

Figure 5:
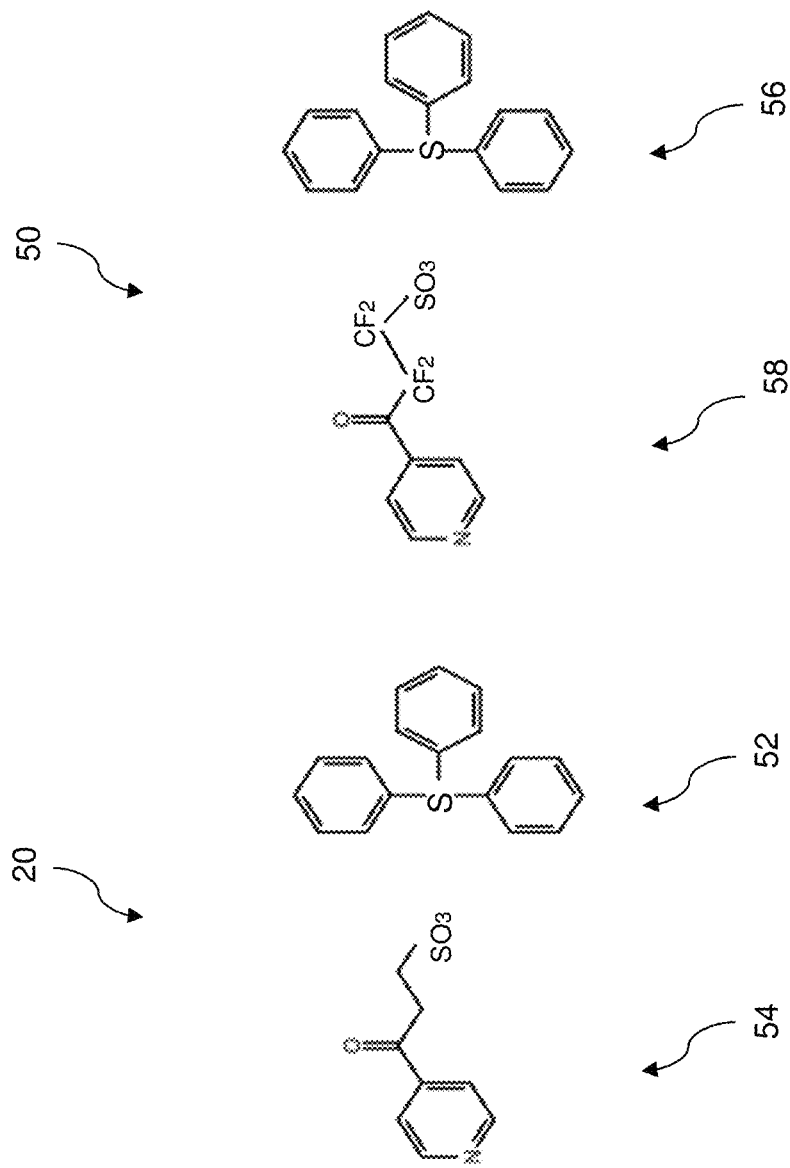

Similarly, the chemical additive in the resist 10 may be a quencher additive (or referred to as a second quencher). The quencher additive is another type of quencher different from the quencher 20 in chemical structure. The quencher additive is designed to function as quencher and further have a strong polar unit to achieve a gradient distribution in the resist 10. Particularly, the quencher additive has a chemical structure having two functional units bonded together. The first functional unit is designed to have quencher function. The second functional unit is the strong polar unit that can interact with the middle layer. In some examples, the second functional unit includes a fluorine rich polymeric composition so to enable the second quencher to have a gradient concentration increasing from the bottom surface to the top surface. In some examples, the chemical structures of both the quencher 20 and the quencher additive 50 are provided in FIG. 5 as a comparison according to some examples. The quencher 20 includes two chemical units 52 and 54 while the quencher additive 50 includes the quenching unit 56 and the strong polar unit 58. Due to the interaction between the strong polar unit 58 of the quencher additive 50 and the middle layer, the quencher additive 50 has higher concentration at the top portion of the resist 10 than the bottom portion of the resist 10. Specifically, the quencher additive 50 has a gradient contribution in the resist layer such that the corresponding quencher additive concentration decreases from the top portion to the bottom portion of the resist layer. The quencher 20 may have a substantial uniform distribution in the resist layer. Both quencher 20 and the quencher additive collectively have a higher concentration in the top portion than the bottom portion of the resist layer. This compensates the lower de-protection effect, reduces the footing profile and improves CD uniformity.

In yet another embodiment, the chemical additive 24 in the resist 10 is a first polymer additive (or referred to as a second polymer). The first polymer additive functions to resist etching, similar to the polymer 12 in term of etch resistance but having different spatial distribution in the resist and different solubility in the developer. Particularly, the first polymer additive is designed with chemical composition to achieve a non-uniform distribution in the resist layer. Both the polymer 12 and the first polymer additive collectively have a non-uniform solubility in the developer, specifically, a lower solubility in the top portion than the bottom portion of the resist layer. In the present embodiment, the polymer 12 and the first polymer additive are designed with different chemical structures to have phase separation such that one (such as the polymer additive) is substantially distributed in the top portion of the resist layer and another one (such as the polymer 12) is substantially distributed in the bottom portion of the resist layer. In various examples, the polymer solubility and distribution can be adjusted by the activation energy Ea of the ALG, molecular weight (MW), polarity and the ratio of PHS, bulky ALG, or bulky lactone according to various examples.

Figure 6:
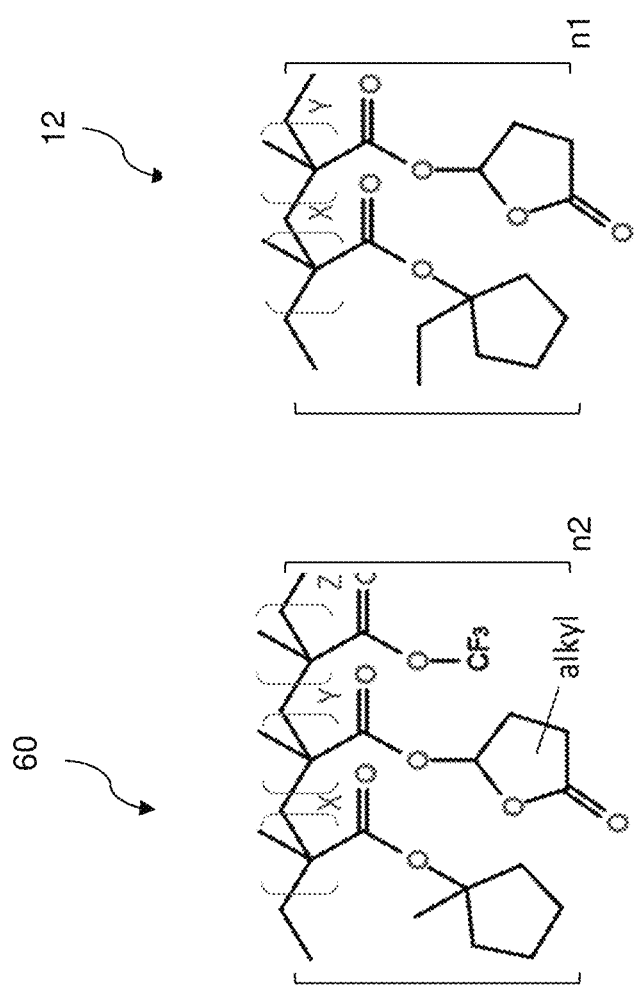

In the present embodiment, the first polymer additive is tuned to have a gradient concentration that decreases from the top to the bottom of the resist layer. Additionally, the polymer 12 is also tuned to have non-uniform distribution that increases from the top to the bottom of the resist layer. FIG. 6 provides exemplary structures of the polymer 12 and the first polymer additive 60 in accordance with some embodiments. In FIG. 6, n1 and n2 are integers that are associated with polymerization degrees and molecular weights of the polymer 12 and the first polymer additive 60, respectively. Particularly, the first polymer additive 60 has a molecular weight greater than the molecular weight of the polymer 12, in order to effectively reduce the solubility of the top portion of the resist, prevent the resist loss, and eliminate the footing profile. In some examples, the molecular weight of the first polymer additive 60 ranges from 6000 to 20000 while the molecular weight of the polymer 12 ranges from 2000 to 8000. The first polymer additive 60 includes a fluorine-containing unit. Comparatively, the polymer 12 is substantially distributed in the bottom portion of the resist layer while the first polymer additive 60 is substantially distributed in the top portion of the resist layer. The subscripts X, Y and Z are proper integers. The first polymer additive 60 and the polymer 12 are designed with X, Y and Z in proper ranges to meet above the criteria for better resist imaging quality. For example, due to the existence of Z, which is 1 or greater, the first polymer additive 60 has a molecular weight greater than the molecular weight of the polymer 12. In furtherance of the example, the subscript Z ranges between 3 and 20.

In various examples, the first polymer additive is designed to be substantially distributed in the top portion of the resist layer and to have less solubility in the developer by having higher activation energy Ea, greater molecular weight, fluorine-containing chemical, or a combination thereof, compared with the polymer 12.

In yet another embodiment, the chemical additive 24 in the resist 10 is a chemical component to provide the resist with etching resistance, similar to the polymer 12 but with higher etching resistance than the polymer 12, therefore being referred to as second polymer additive. The second polymer additive is different from the polymer 12 in etching resistance and spatial distribution. The second polymer additive is designed to have stronger etching resistance and further to have a non-uniform spatial distribution in the resist. Particularly, the second polymer additive is designed with chemical composition to achieve a gradient distribution in the resist layer such that the concentration of the second polymer in the top portion of the resist layer is substantially greater than the concentration in the bottom portion of the resist layer. In other words, the second polymer additive has a gradient distribution that decreases from the top surface to the bottom surface of the resist layer. Similarly, the second polymer additive includes a chemical unit, such as fluorine-containing unit, to achieve such a gradient distribution in the resist layer.

Figure 7:
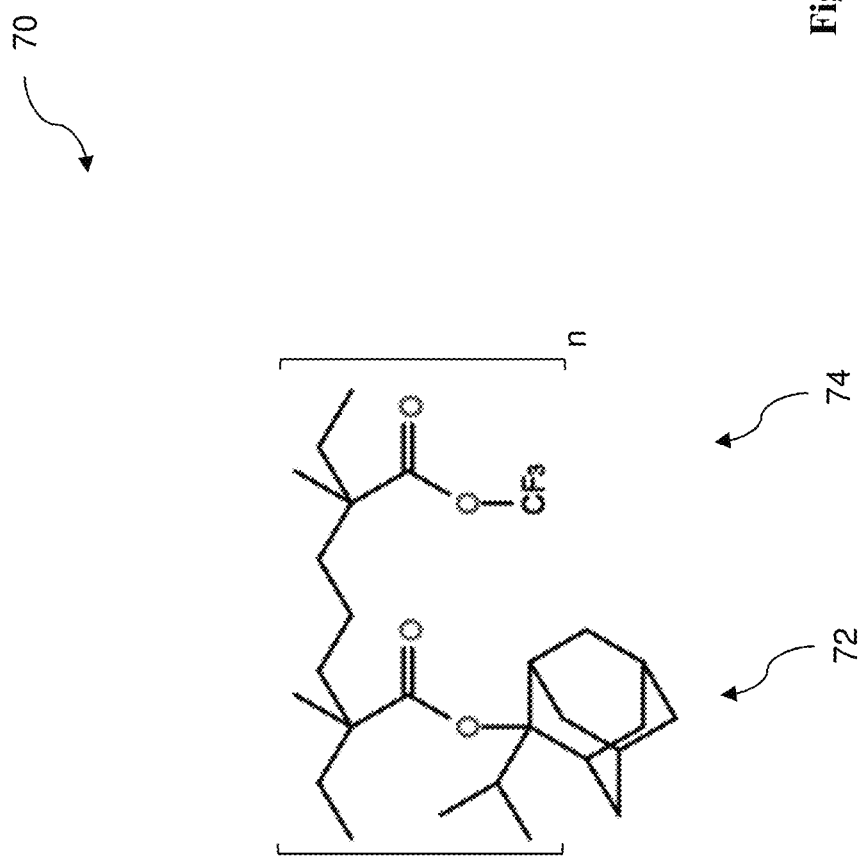

FIG. 7 provides an exemplary structure of the second polymer additive 70 in accordance with some embodiments. In FIG. 7, the parameter n is an integer that is associated with polymerization degree and molecular weight of the second polymer additive 70. Particularly, the second polymer additive 70 has two chemical units bonded together. The first functional unit 72 contributes to the etching resistance greater than that of the polymer 12. The second functional unit 74 contributes to the gradient distribution in the resist 10. In the example illustrated in FIG. 7, the second functional unit 74 includes fluorine. Due to the gradient distribution and greater etching resistance of the second polymer additive, collectively, the polymer 12 and the second polymer additive provide greater etching resistance in the top portion than the bottom portion. Thus, the second polymer additive is able to improve the resist budget window and has a larger tolerance window to the rounding profile. The second polymer additive also improves CD uniformity. The method to perform a lithography process, using the resist material disclosed above, is further described below in details.

FIG. 8 is a flow chart of a method 100 of patterning a substrate (e.g., a semiconductor wafer) according to various aspects of the present disclosure in some embodiments. The method 100 may be implemented, in whole or in part, by a system employing advanced lithography processes such as deep ultraviolet (DUV) lithography, extreme ultraviolet (EUV) lithography, electron beam (e-beam) lithography, x-ray lithography, and/or other lithography processes to improve pattern dimension accuracy. In the present embodiment, EUV and/or e-beam lithography is used as the primary example. Additional operations can be provided before, during, and after the method 100, and some operations described can be replaced, eliminated, or moved around for additional embodiments of the method.

FIGS. 9A through 9E are sectional views of a semiconductor structure 200 at various fabrication stages, constructed in accordance with some embodiments. The method 100 is described below in conjunction with FIG. 8 and FIGS. 9A through 9E wherein the semiconductor structure 200 is fabricated by using embodiments of the method 100. The semiconductor structure 200 may be an intermediate workpiece fabricated during processing of an IC, or a portion thereof, that may include logic circuits, memory structures, passive components (such as resistors, capacitors, and inductors), and active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Referring now to FIG. 8 in conjunction with FIG. 9A, the method 100 begins at block 102 with a semiconductor structure 200. Referring to FIG. 9A, the semiconductor structure 200 includes a substrate 202. In an embodiment, the substrate 202 is a semiconductor substrate (e.g., wafer). In another embodiment, the substrate 202 includes silicon in a crystalline structure. In alternative embodiments, the substrate 202 includes other elementary semiconductors such as germanium, or a compound semiconductor such as silicon carbide, gallium arsenide, indium arsenide, and indium phosphide. The substrate 202 includes one or more layers of material or composition. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

In the present embodiment, an under layer (or material layer) 204 is formed on the substrate 204. The under layer 204 may be a material layer to be processed, such as to be patterned or to be implanted. For example, the under layer 204 is a hard mask layer to be patterned. In another example, the under layer 204 is an epitaxial semiconductor layer to be ion implanted. In an embodiment, the under layer 204 is a hard mask layer including material(s) such as silicon oxide, silicon nitride (SiN), silicon oxynitride, or other suitable material or composition. In an embodiment, the under layer 204 is an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In various embodiments, the under layer 204 may include a high-k dielectric layer, a gate layer, a hard mask layer, an interfacial layer, a capping layer, a diffusion/barrier layer, a dielectric layer, a conductive layer, other suitable layers, and/or combinations thereof.

In the present embodiment, the under layer may be portions of a tri-layer photoresist. In this case, the under layer 204 includes a bottom film and a middle film disposed on the bottom film. In the furtherance of the embodiment, the bottom film is a carbon-rich polymeric material and the middle film is a silicon-rich material to provide etching selectivity. Both the bottom film and middle film are formed by spin-coating and may be further cured by a curing operation, such as thermal baking or UV curing according to some examples.

In some embodiments, the structure 200 may be alternatively a photomask used to pattern a semiconductor wafer. In furtherance of the embodiments, the substrate 202 is a photomask substrate that may include a transparent material (such as quartz), or a low thermal expansion material such as silicon oxide-titanium oxide compound. The photomask substrate 202 may further include a material layer to be patterned. To further this example, the substrate 202 may be a photomask substrate for making a deep ultraviolet (DUV) mask, an extreme ultraviolet (EUV) mask, or other types of masks. Accordingly, the underlayer 204 is material layer to be patterned to define a circuit pattern. For example, the underlayer 204 is an absorber layer, such as chromium layer.

The method 100 proceeds to operation 104 with forming a photoresist layer (or simply resist layer) 10 over the substrate 202 (FIG. 9). The resist layer 10 is sensitive to the radiation used in a lithography exposing process and has a resistance to etch. Referring to FIG. 9A, in an embodiment, the resist layer 10 is disposed by spin-coating process. In some embodiments, the resist layer 10 is further treated with a soft baking process. In some embodiments, the resist layer 10 is sensitive to a radiation, such as I-line light, a DUV light (e.g., 248 nm radiation by krypton fluoride (KrF) excimer laser or 193 nm radiation by argon fluoride (ArF) excimer laser), a EUV light (e.g., 135 nm light), an electron beam (e-beam), and an ion beam.

In the present example, the photoresist utilizes a chemical amplification (CA) photoresist material. For example, the CA resist material is positive tone and turns soluble to a developer after the polymer material is reacted with acid. Alternatively, the CA resist material is negative tone and turns insoluble to a developer such as a base solution after the polymer is reacted with acid. In yet another example, the CA resist material includes a polymer material that changes its polarity after the polymer is reacted with acid.

Before and during spin-coating the resist layer 10 onto the substrate, the resist 10 is in a liquid state, so it is also referred to as resist solution. The resist 10 is described above with reference to FIGS. 1A through 7. The resist 10 includes polymer 12, PAG 14, quencher 20, solvent 22 and chemical additive 24. The chemical additive 24 is designed with chemical characteristic to have a gradient distribution when it is coated on the substrate 202. In some examples, the chemical additive 24 has a chemical structure with two functional units bonded together: one functional unit is able to cause a non-uniform distribution in the resist layer and another functional unit has a characteristic to compensate the variation of the resist layer from top to bottom during the exposing process. The chemical additive 24 may be a dissolution additive (such as the dissolution additive 30 in FIG. 3), a PAG additive (such as the PAG additive 40 in FIG. 4), a quencher additive (such as the quencher additive 50 in FIG. 5), a first polymer additive (such as the first polymer additive 60 in FIG. 6), or a second polymer additive (such as the second polymer additive 70 in FIG. 7), as described above in various embodiments.

Referring to FIGS. 8 and 9B, the method 100 proceeds to operation 106 by performing an exposing process to the resist layer 10 to the first radiation beam in a lithography system. In some embodiments, the first radiation is a EUV radiation (e.g., 13.5 nm). In some embodiments, the first radiation may be an I-line (365 nm), a DUV radiation such as KrF excimer laser (248 nm), ArF excimer laser (193 nm), a EUV radiation, an x-ray, an e-beam, an ion beam, and/or other suitable radiations. The operation 106 may be performed in air, in a liquid (immersion lithography), or in a vacuum (e.g., for EUV lithography and e-beam lithography).

In some embodiments, the radiation beam is directed to the resist layer 10 to form an image of a circuit pattern defined on a photomask, such as a transmissive mask or a reflective mask in a proper exposing mode, such as step and scan. Various resolution enhancement techniques, such as phase-shifting, off-axis illumination (OAI) and/or optical proximity correction (OPC), may be used implemented through the photomask or the exposing process. For examples, the OPC features may be incorporated into the circuit pattern. In another example, the photomask is a phase-shift mask, such as an alternative phase-shift mask, an attenuated phase-shift mask, or a chromeless phase-shift mask. In yet another exmaple, the exposing process is implemented in an off-axis illumination mode. In some other embodiments, the radiation beam is directly modulated with a predefined pattern, such as an IC layout, without using a mask (such as using a digital pattern generator or direct-write mode). In the present embodiment, the radiation beam is a EUV radiation and the operation 106 is performed in a EUV lithography system, such as the EUV lithography system.

After the exposing process, the operation 106 may further include other steps, such as thermal treatment. In the present embodiment, the operation 106 includes a post-exposure baking (PEB) process to the semiconductor structure 200, especially to the resist layer 10 coated on the substrate 202. During the PEB process, the ALG 16 in the exposed resist material is cleaved, the exposed portions of the resist material are changed chemically (such as more hydrophilic or more hydrophobic). In a specific embodiment, the PEB process may be performed in a thermal chamber at temperature ranging between about 120° C. to about 160° C.

After the operation 106, a latent pattern is formed on the resist layer 10. The latent pattern of a resist layer refers to the exposed pattern on the resist layer, which eventually becomes a physical resist pattern, such as by a developing process. The latent pattern of the resist layer 10 includes exposed portions 10a and unexposed portions 10b. In the present case, of the latent pattern, the exposed portions 10a of the resist layer 10 are chemically changed. In some examples, the exposed portions 10a are de-protected, inducing polarity change for dual-tone developing. In other examples, the exposed portions 10a are changed in polymerization, such as depolymerized as in positive resist or cross-linked as in negative resist.

Referring to FIGS. 8 and 9C, the method 100 then proceeds to operation 108 by developing the exposed resist layer 10 in a developer, constructed in accordance with some embodiments. By the developing process, a patterned resist layer 10' is formed. In some embodiments, the resist layer 10 experiences a polarity change after the operation 106, and a dual-tone developing process may be implemented. In some examples, the resist layer 10 is changed from a nonpolar state (hydrophobic state) to a polar state (hydrophilic state), then the exposed portions 10a will be removed by an aqueous solvent (positive tone imaging), such as tetramethyl ammonium hydroxide (TMAH), or alternatively the unexposed portions 10b will be removed by an organic solvent (negative tone imaging), such as butyl acetate. In some other examples, the resist layer 10 is changed from a polar state to a nonpolar state, then the exposed portions 10a will be removed by an organic solvent (positive tone imaging) or the unexposed portions 10b will be removed by an aqueous solvent (negative tone imaging).

In the present example illustrated in FIG. 9C, the unexposed portions 10b are removed in the developing process. In this example shown in FIG. 9C, the patterned resist layer 10' is represented by two line patterns. However, the following discussion is equally applicable to resist patterns represented by trenches.

Referring to FIGS. 8 and 9D, the method 100 includes an operation 110 by performing a fabrication process to the semiconductor structure 200 using the patterned resist layer 10' as a mask such that the fabrication process is only applied to the portions of the semiconductor structure 200 within the openings of the patterned resist layer 10' while other portions covered by the patterned resist layer 10' are protected from being impacted by the fabrication process. In some embodiments, the fabrication process includes an etching process applied to the material layer 204 using the patterned resist layer 10' as an etch mask, thereby transferring the pattern from the patterned resist layer 10' to the material layer 204. In alternative embodiments, the fabrication process includes an ion implantation process applied to the semiconductor structure 200 using the patterned resist layer as an implantation mask, thereby forming various doped features in the semiconductor structure 200.

In the present example, the material layer 204 is a hard mask layer. To further this embodiment, the pattern is first transferred from the patterned resist layer 10' to the hard mask layer 204, then to other layers of the substrate 202. For example, the hard mask layer 204 may be etched through openings of the patterned resist layer 10' using a dry (plasma) etching, a wet etching, and/or other etching methods. For example, a dry etching process may implement an oxygen-containing gas, a fluorine-containing gas, a chlorine-containing gas, a bromine-containing gas, an iodine-containing gas, other suitable gases and/or plasmas, and/or combinations thereof. The patterned resist layer 10' may be partially or completely consumed during the etching of the hard mask layer 204. In an embodiment, any remaining portion of the patterned resist layer 10' may be stripped off, leaving a patterned hard mask layer 204' over the substrate 202, as illustrated in FIG. 9E.

Although not shown in FIG. 8, the method 100 may include other operations before, during or after the operations described above. In an embodiment, the substrate 202 is a semiconductor substrate and the method 100 proceeds to forming fin field effect transistor (FinFET) structures. In this embodiment, the method 100 includes forming a plurality of active fins in the semiconductor substrate 202. In furtherance of the embodiment, the operation 110 further includes etching the substrate 202 through the openings of the patterned hard mask 204' to form trenches in the substrate 202; filling the trenches with a dielectric material; performing a chemical mechanical polishing (CMP) process to form shallow trench isolation (STI) features; and epitaxy growing or recessing the STI features to form fin-like active regions. In another embodiment, the method 100 includes other operations to form a plurality of gate electrodes in the semiconductor substrate 202. The method 100 may further form gate spacers, doped source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate 202, which has been etched by operation 110 to form a plurality of trenches. The method 100 proceeds to filling the trenches with a conductive material, such as a metal; and further proceeds to polishing the conductive material using a process such as chemical mechanical planarization (CMP) to expose the patterned ILD layer, thereby forming the metal lines in the ILD layer. The above are non-limiting examples of devices/structures that can be made and/or improved using the method and the material layer according to various aspects of the present disclosure.

The present disclosure provides a photoresist material with a gradient composition to compensate the footing profile issues. In various embodiments, the photoresist material includes a polymer, a PAG, a quencher and a chemical additive mixed in a solvent with a composition designed to achieve a non-uniform distribution and accordingly a non-uniform characteristic parameter, such as dissolution rate, photosensitivity, etching resistance or a combination thereof, thus compensating variation of the resist in the exposing process, reducing the footing issues and improving uniform CD of the patterned resist layer. The chemical additive may be a second polymer, a second PAG, a second quencher, or a combination thereof. For example, the chemical additive includes both a second PAG and a second quencher to have enhanced compensation effects from the both. In another example, the chemical additive includes both a second PAG and a second polymer.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

Thus, the present disclosure provides an embodiment of a method for lithography patterning. The method includes coating a photoresist layer over a substrate, wherein the photoresist layer includes a first polymer, and a first photo-acid generator (PAG), and a chemical additive mixed in a solvent; performing an exposing process to the photoresist layer; and performing a developing process to the photoresist layer to form a patterned photoresist layer. The chemical additive has a non-uniform distribution in the photoresist layer.

The present disclosure provides a method for lithography patterning according to another embodiment. The method includes forming a photoresist layer over a substrate. The photoresist layer includes a polymer, a first photo-acid generator (PAG), and a second PAG mixed in a solvent. The second PAG is different from the first PAG in composition. The second PAG has a gradient concentration decreasing from a top surface to a bottom surface of the photoresist layer. The method further includes performing an exposing process to the photoresist layer; and developing the photoresist layer, thereby forming a patterned photoresist layer.

The present disclosure also provides a method for lithography patterning according to another embodiment. The method includes forming a photoresist layer over a substrate. The photoresist layer includes a polymer, a photo-acid generator (PAG), and a first quencher and a second quencher mixed in a solvent. The second quencher is different from the first quencher in composition. The second quencher has a higher interaction to the polymer than that of the first quencher such that the second quencher has a higher concentration in a bottom portion of the photoresist layer and a lower concentration in a top portion of the photoresist layer. The method further includes performing an exposing process to the photoresist layer; and developing the photoresist layer, thereby forming a patterned photoresist layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for lithography patterning, comprising:

providing a photoresist solution, wherein the photoresist solution includes a first polymer, a second polymer different from the first polymer in composition, a first photo-acid generator (PAG), and a second PAG different from the first PAG in composition, wherein the first polymer includes a chemical structure formulated as

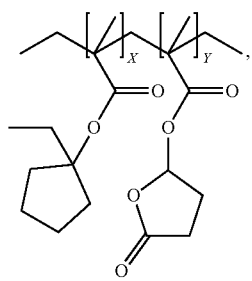

wherein the second polymer includes a chemical structure formulated as

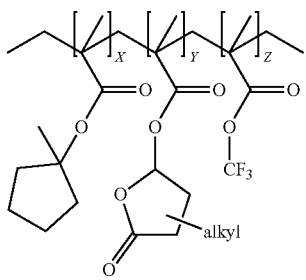

with each of parameters X, Y, and Z being a positive integer and selected such that the second polymer has a higher molecular weight than the first polymer, wherein the first PAG includes a chemical structure having two chemical units bonded together, the first PAG being formulated as

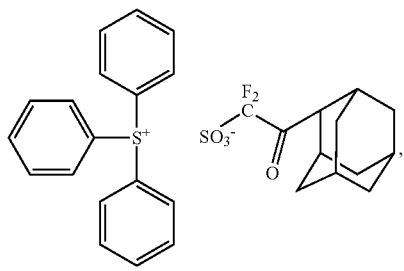

and wherein the second PAG includes a chemical structure having two chemical units bonded together, the second PAG being formulated as

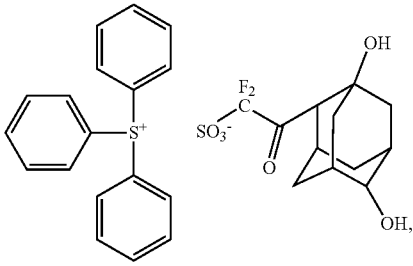

coating the photoresist solution over a substrate to form a photoresist layer, the photoresist layer having a top surface facing away from the substrate and a bottom surface facing the substrate, wherein the coating of the photoresist solution results in the first polymer and the first PAG being distributed uniformly from the top surface to the bottom surface of the photoresist layer, the second polymer having a continuous concentration gradient decreasing from the top surface to the bottom surface of the photoresist layer, and the second PAG having a continuous concentration gradient increasing from the top surface to the bottom surface of the photoresist layer;

performing an exposing process to the photoresist layer; and dissolving portions of the exposed photoresist layer using a solvent to form a patterned photoresist layer, wherein the continuous concentration gradients of the second polymer and the second PAG cause solubility of the exposed photoresist layer to increase from the top surface to the bottom surface.

2. The method of claim 1, further comprising performing an etching process using the patterned photoresist layer as a mask, wherein the second polymer has an etch resistance greater than the first polymer.

3. The method of claim 1, wherein the coating of the photoresist solution over the substrate results in the second polymer and the first polymer to phase-separate in the photoresist layer.

4. The method of claim 1, wherein the second polymer has a solubility less than that of the first polymer during the dissolving process.

5. The method of claim 1, wherein the first PAG has a uniform distribution from the top surface to the bottom surface of the photoresist layer.

6. The method of claim 1, further comprising, prior to the coating of the photoresist solution over the substrate, forming a carbon-rich bottom layer over the substrate; and forming a silicon-rich middle layer over the carbon-rich bottom layer.

7. The method of claim 1, wherein the forming of the photoresist layer causes the first PAG and the second PAG to phase-separate in the photoresist layer.

8. A method for lithography patterning, comprising:

forming a photoresist layer over a substrate, wherein the photoresist layer has a bottom surface facing the substrate and a top surface facing away from the substrate, wherein the photoresist layer includes a polymer, a first photo-acid generator (PAG), a second PAG different from the first PAG in composition, a first quencher, and a second quencher different from the first quencher in composition, wherein the first PAG includes a chemical structure having two chemical units bonded together, the first PAG being formulated as

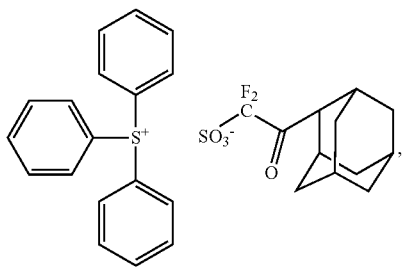

wherein the second PAG includes a chemical structure having two chemical units bonded together, the second PAG being formulated as

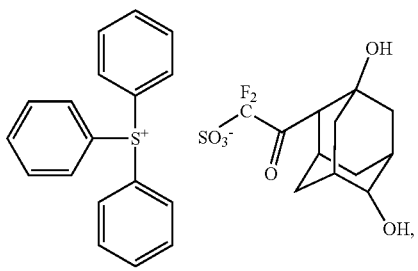

the second PAG having a continuous gradient concentration increasing from a top surface to a bottom surface of the photoresist layer, wherein the first quencher includes a chemical structure having two chemical units bonded together, the first quencher being formulated as

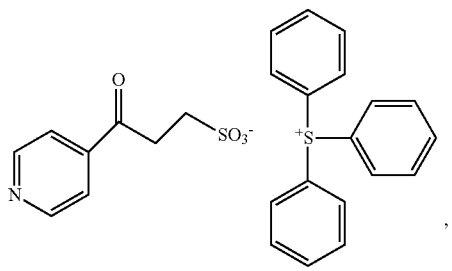

wherein the second quencher includes a chemical structure having two chemical units bonded together, the second quencher being formulated as,

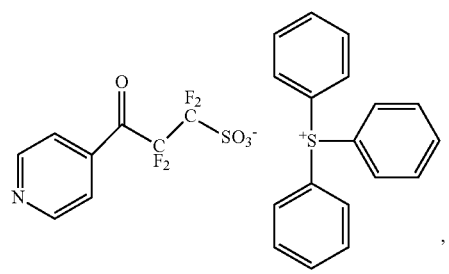

the second quencher having a continuous gradient concentration decreasing from the top surface to the bottom surface of the photoresist layer;

performing an exposing process to the photoresist layer; and developing the photoresist layer, wherein developing the photoresist layer removes a greater portion of the photoresist layer near the bottom surface than the top surface.

9. The method of claim 8, wherein the first PAG has a uniform distribution from the top surface to the bottom surface of the photoresist layer.

10. The method of claim 8, further comprising, prior to the forming of the photoresist layer over a substrate,
  forming a carbon-rich bottom layer over the substrate; and
  forming a silicon-rich middle layer over the carbon-rich bottom layer.

11. The method of claim 10, wherein the second PAG has stronger interaction with the silicon-rich middle layer than with the polymer, thereby causing the second PAG to have the continuous gradient concentration increasing from the top surface to the bottom surface of the photoresist layer.

12. The method of claim 8, wherein the forming of the photoresist layer causes the second PAG and the first PAG to phase-separate in the photoresist layer.

13. The method of claim 8, wherein the first quencher has a uniform distribution from the top surface to the bottom surface of the photoresist layer.

14. The method of claim 8, wherein the forming of the photoresist layer causes the second quencher and the first quencher to phase-separate in the photoresist layer.

15. A method for lithography patterning, comprising:
  providing a semiconductor substrate;
  forming a photoresist layer over the semiconductor substrate, wherein the photoresist layer includes a polymer, a photo-acid generator (PAG), and a dissolution additive,
  wherein the polymer is formulated as

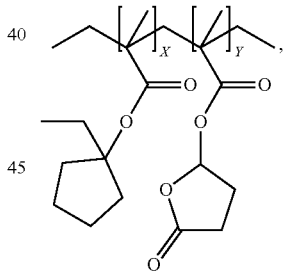

wherein the dissolution additive includes a first functional unit containing fluorine and a second functional unit bonded to the first functional unit, the dissolution additive being formulated as

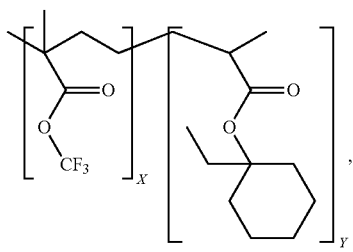

with X and Y each being a positive integer and selected such that a molecular weight of the dissolution additive is greater than that of the polymer, and
    wherein a concentration gradient of the dissolution additive continuously decreases from a top surface to a bottom surface of the photoresist layer;

exposing the photoresist layer to a radiation source;

applying a developer to the exposed photoresist layer, thereby forming a patterned photoresist layer, wherein the developer removes a greater amount of the photoresist layer near the bottom surface than the top surface; and etching the semiconductor substrate using the patterned photoresist layer as a mask.

16. The method of claim 15, wherein the dissolution additive is formulated with a polar unit ratio greater than that of the polymer.

17. The method of claim 15, wherein the first functional unit of the dissolution additive is configured to lower surface tension of the dissolution additive.

18. The method of claim 17, wherein the surface tension of the dissolution additive is less than 20 mN/m.

19. The method of claim 15, wherein the second functional unit of the dissolution additive is configured to reduce dissolution rate of the photoresist layer in the developer.

20. The method of claim 15, wherein the dissolution additive has an etching resistance greater than that of the polymer during the etching process.

* * * * *